(12) United States Patent
Totsuka

(10) Patent No.: US 6,842,049 B2
(45) Date of Patent: Jan. 11, 2005

(54) METHOD OF AND APPARATUS FOR DETECTING DIFFERENCE BETWEEN THE FREQUENCIES, AND PHASE LOCKED LOOP CIRCUIT

(75) Inventor: Hirofumi Totsuka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/828,181

(22) Filed: Apr. 21, 2004

(65) Prior Publication Data

US 2004/0196070 A1 Oct. 7, 2004

Related U.S. Application Data

(62) Division of application No. 10/166,255, filed on Jun. 11, 2002, now Pat. No. 6,750,682.

(30) Foreign Application Priority Data

Nov. 7, 2001 (JP) ........................................ 2001-342488

(51) Int. Cl.[7] .............................................. H03D 13/00
(52) U.S. Cl. .......................... 327/40; 331/37; 324/76.41
(58) Field of Search ...................... 327/39–49, 156–159; 331/16–18, 34, 37–43; 324/76.41–76.48

(56) References Cited

U.S. PATENT DOCUMENTS

| | | | | |
|---|---|---|---|---|
| 4,430,611 A | * | 2/1984 | Boland ..................... | 324/76.53 |
| 4,438,405 A | | 3/1984 | Yazawa et al. ............... | 327/39 |
| 5,598,130 A | | 1/1997 | Mesuda et al. .............. | 332/119 |
| 5,825,254 A | | 10/1998 | Lee .............................. | 331/25 |
| 5,847,615 A | | 12/1998 | Roth ........................ | 324/76.41 |
| 6,249,160 B1 | | 6/2001 | Tagami et al. .............. | 327/165 |
| 6,541,951 B2 | | 4/2003 | Shirance et al. ............. | 331/16 |

FOREIGN PATENT DOCUMENTS

| | | |
|---|---|---|
| JP | 55-79534 | 6/1980 |
| JP | 4-2216 | 1/1992 |
| JP | 8-191245 | 7/1996 |
| JP | 10-163863 | 6/1998 |

OTHER PUBLICATIONS

M. Akashi et al., 2.5 Gbit/s Clock and Data Recovery for IC Fiberoptic Transmission, Proceedings of the General Conference of the Year 1998 of the IEICE, 1998 p. 189, C–12–61, Information and Communication Engineers (IEICE), Japan.

* cited by examiner

*Primary Examiner*—Minh Nguyen
(74) *Attorney, Agent, or Firm*—Burns, Doane, Swecker & Mathis, L.L.P.

(57) ABSTRACT

An apparatus for detecting a difference between frequencies includes a beat waveform generator which generates a beat waveform signal having a frequency which is equal to a difference between frequencies of a reference clock signal and a target clock signal. A frequency divider divides the reference clock signal by N, where N is an integer, to generate a divided reference-clock signal. A frequency comparator compares frequencies of the beat waveform signal and the divided reference-clock signal, and generates a step out alarm signal which is a binary signal depending upon a polarity of a difference between the frequencies of the beat waveform signal and the divided reference-clock signal.

10 Claims, 5 Drawing Sheets

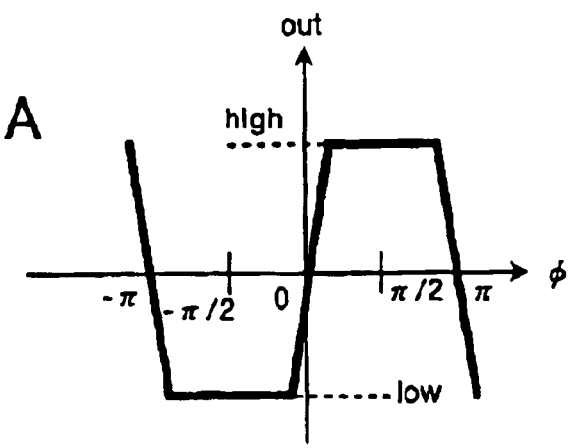
FIG.11A
FIRST BEAT WAVEFORM SIGNAL 101
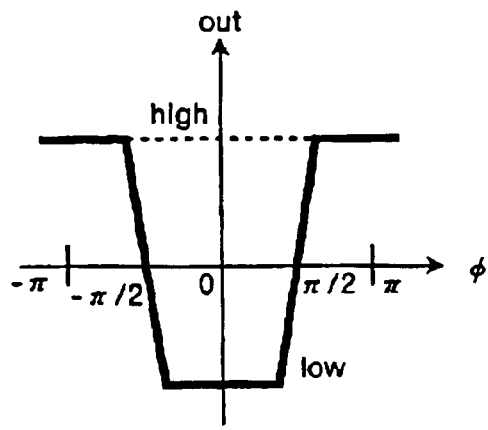
FIG.11B
SECOND BEAT WAVEFORM SIGNAL 102
FIG.12A
$\omega_{CLK} > \omega_{VCOCLK(1)}$
FIRST BEAT WAVEFORM SIGNAL 101
SECOND BEAT WAVEFORM SIGNAL 102
FIG.12B
$\omega_{CLK} < \omega_{VCOCLK(1)}$
FIRST BEAT WAVEFORM SIGNAL 101
SECOND BEAT WAVEFORM SIGNAL 102

METHOD OF AND APPARATUS FOR DETECTING DIFFERENCE BETWEEN THE FREQUENCIES, AND PHASE LOCKED LOOP CIRCUIT

This application is a divisional of application Ser. No. 10/166,255 filed Jun. 11, 2002, now U.S. Pat. No. 6,750,682, the entire contents of which are incorporated herein by reference.

FIELD OF THE INVENTION

The present invention relates to a method of and apparatus for detecting a frequency drift of a value exceeding a specified value with respect to a reference clock in a Phase Locked Loop (PLL), and issuing an alarm when the detected frequency drift is higher than a specified value.

BACKGROUND OF THE INVENTION

The conventional technology of this field will be explained below. FIG. 9 is a diagram showing a configuration of a PLL disclosed in "Timing extraction/identification/reproduction IC for 2.5 Gbit/s optical transmission" by Akashi et al., 1998 General Conference of IEICE, Spring C-12-61. In FIG. 9, the legend 101 represents a first phase comparator (PD), 102 represents a second phase comparator (PD), 103 represents a frequency comparator (FD), 104 represents a selector (SEL), 105 represents a low-pass filter (LPF), 106 represents a step out detector, and 107 represents a voltage controlled oscillator (VCO) that outputs a first extracted clock (VCOCLK (1)) and a second extracted clock (VCOCLK (2)) whose phase lags a phase of the first extracted clock by 90 degrees. The first phase comparator 101, second phase comparator 102, frequency comparator 103, and the selector 104 constitute a phase frequency comparison section 111.

The operation of the phase frequency comparison section 111 and the operation of the overall PLL will be explained below. The first phase comparator 101 detects a phase difference between an input signal (DATA or CLK) and the first extracted clock. Likewise, the second phase comparator 102 detects a phase difference between the input signal and the second extracted clock.

As shown in FIG. 10, each of the phase comparators 101 and 102 is composed of a mixer (MIX) 112 and a low-pass-filter (LPF) 113. If we let the input signal be $\sin(\omega_{CLK}t+\alpha)$ and the first extracted clock be $\sin(\omega_{VCOCLK(1)}t+\beta)$, a signal output from the mixer 112 in the first phase comparator 101 is obtained as follows:

$$\sin\{(\omega_{CLK} - \omega_{VCOCLK(1)})t + (\alpha - \beta)\} \times \qquad (1)$$

$$\sin\{(\omega_{CLK} + \omega_{VCOCLK(1)})t + (\alpha + \beta)\}$$

That is, the signal output from the mixer 112 has a frequency component which is a sum and a difference between the two signals. In the expression (1), $\omega_{CLK}$ represents an angular frequency of the input signal, t represents a time, $\alpha$ represents a phase of the input signal, $\omega_{VCOCLK(1)}$ represents an angular frequency of the first extracted clock, and $\beta$ represents a phase of the first extracted clock.

The low-pass filter 113 removes the sum component from the signal output from the mixer 112. Accordingly, the output signal of the first phase comparator 101 is obtained as follows:

$$\sin\{(\omega_{CLK} - \omega_{VCOCLK(1)})t + (\alpha - \beta)\} \qquad (2)$$

which can be expressed by a difference component between frequencies of the input signal and the first extracted clock.

On the other hand, in the second phase comparator 102, the second extracted clock becomes $\sin(\omega_{VCOCLK(1)}t+\beta+\pi/2)$, therefore, an output signal is obtained as follows:

$$\sin\{(\omega_{CLK} - \omega_{VCOCLK(1)})t + (\alpha - \beta) - \pi/2\} = \qquad (3)$$

$$-\cos\{(\omega_{CLK} - \omega_{VCOCLK(1)})t + (\alpha - \beta)\}$$

As explained above, each of the two phase comparators outputs a beat waveform signal having the component showing the difference between frequencies ($\omega_{CLK} - \omega_{VCOCLK(1)}$) of the input signal and each of the extracted clocks.

For example, the output characteristic of each of the phase comparators 101 and 102, when frequencies are synchronous, can be expressed as shown in FIGS. 11A and 11B by substituting $\omega_{CLK} - \omega_{VCOCLK(1)} = 0$ into the expressions (2) and (3). When a phase difference $\phi(\phi=\alpha-\beta)$ is $\pm\pi/2$ or less, the output of the first phase comparator 101 changes to a linear operation with respect to the phase difference particularly around zero. At this time, the level of the output of the second phase comparator 102 is fixed to LOW. Further, when the phase difference becomes $\pm\pi/2$ or more, the level of the output of the second phase comparator 102 changes in the linear region to be fixed to HIGH.

Each phase relationship between the output beat waveforms of the phase comparators 101 and 102, when the frequencies are asynchronous, can be expressed as shown in FIGS. 12A and 12B depending upon a magnitude relationship between frequencies of the input signal and the extracted clock, respectively. The frequency comparator 103 having received these two beat waveforms detects a phase relationship between the beat waveforms, and outputs binary signals indicating the high and low frequencies. The frequency comparator 103 is composed of, for example, a D type flip-flop. That is, by using a rising edge type of D type flip-flop, when receiving the output beat waveform of the first phase comparator 101 to a data terminal and receiving the output beat waveform of the second phase comparator 102 to a clock terminal, the frequency comparator 103 outputs a HIGH signal when the frequency of the input signal is high and outputs a LOW signal when it is low, that is, the frequency comparator 103 outputs binary digital signals indicating the high and low frequencies.

Output of the second phase comparator 102 is input to the selector 104 as a select signal through the step out detector 106. The step out detector 106 converts an analog input to a digital output by saturating an analog beat waveform having a linear region.

The selector 104 selects the output of the frequency comparator 103 when the select signal is HIGH, and selects the output of the first phase comparator 101 when the select signal is LOW. When the output of the second phase comparator 102 is HIGH, that is, when a phase difference is $\pm\pi/2$ or more, the output of the frequency comparator 103 is selected. The binary signal is then input to the voltage controlled oscillator 107 through the low-pass filter 105, and the frequency of the extracted clock approaches the frequency of the input signal at a high speed. When the frequencies of the extracted clock and the input signal coincide with each other and the phase difference becomes $\pm\pi/2$ or less (the output of the second phase comparator 102 is LOW), the selector 104 selects the output of the first phase comparator 101 that performs a linear operation around zero, so that phase synchronization is performed with high accuracy.

The step out detector 106 outputs a step out alarm signal by converting an analog output signal of the second phase comparator 102 to a digital signal. That is, the step out detector 106 outputs the step out alarm signal when the state of phase synchronization is changed to a state where a phase difference between the input signal and the first extracted clock becomes ±π/2 or more.

However, the conventional PLL has some problems as follows.

For example, in Optical Internetworking Forum (OIF) or International Telecommunications Union (ITU) as standards used in optical communications, the step out alarm signal is defined to be output when the frequency of an extracted clock has drifted by a specified value with respect to the frequency of a reference clock. However, in the PLL based on die conventional art, the step out alarm signal is disadvantageously output at a specific phase difference (±π/2 in the conventional example). Therefore, the PLL cannot deal with a given specified value.

SUMMARY OF THE INVENTION

It is an object of this invention to obtain a method of and apparatus for detecting a difference between frequencies and a phase locked loop circuit capable of outputting a step out alarm signal when a frequency drift of a given specified value or more between an extracted clock, as an output of a VOC, and a reference clock is detected.

The apparatus for detecting a difference between frequencies according to one aspect of this present invention comprises a beat waveform generating unit which generates a beat waveform signal having a frequency which is equal to a difference between frequencies of a reference clock signal and a target clock signal, a reference-clock dividing unit which divides the reference clock signal by N, where N is an integer, to generate a divided reference-clock signal, and a frequency comparing unit which compares frequencies of the beat waveform signal and the divided reference-clock signal, and generates a step out alarm signal which is a binary signal depending upon a polarity of a difference between the frequencies of the beat waveform signal and the divided reference-clock signal.

The method of detecting a difference between frequencies according to another aspect of this invention comprises generating a beat waveform signal having a frequency which is equal to a difference in frequencies of a reference clock signal and a target clock signal, dividing the reference clock signal by N, where N is an integer, to generate a divided reference-clock signal, and obtaining a polarity of a difference between the frequencies of the beat waveform signal and the divided reference-clock signal, and generating a step out alarm signal which is a binary signal depending upon the obtained polarity.

The phase locked loop circuit according to another aspect of this present invention comprises the apparatus for detecting a difference between frequencies according to the present invention.

Other objects and features of this invention will become understood from the following description with reference to the accompanying drawings.

BRIEF DESCRIPTION OF THE DRAWINGS

FIG. 11A and FIG. 11B show output characteristics of the phase comparators when the frequencies are synchronous; and FIG. 12A and FIG. 12B each show a phase relationship between output beat waveforms of the phase comparators when the frequencies are asynchronous.

DETAILED DESCRIPTIONS

Embodiments of the method of and the apparatus for detecting a difference between frequencies and the phase locked loop circuit according to this invention will be explained in detail below with reference to the drawings. It should be noted that this invention is not limited by these embodiments.

Figure 1:
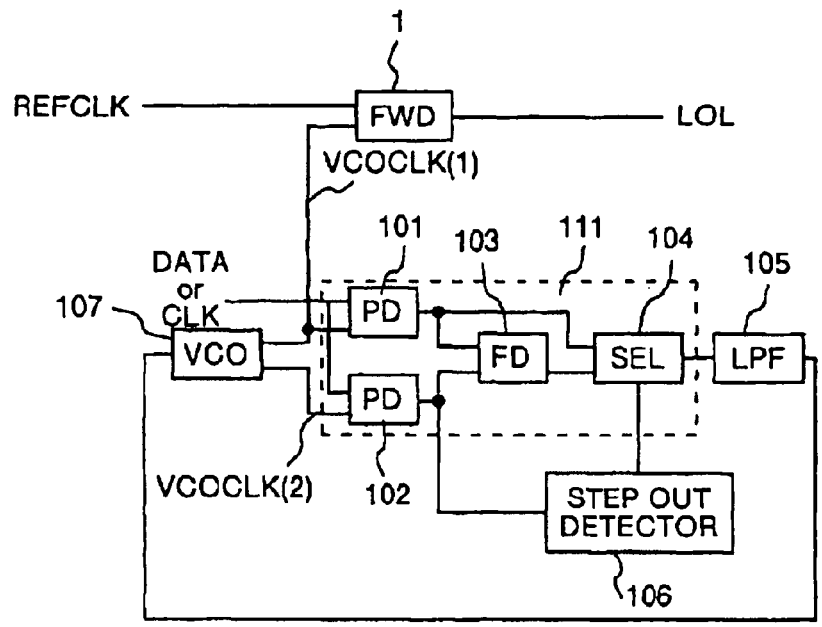
FIG. 1 shows a configuration of the PLL provided with the apparatus for detecting a difference between frequencies according to this invention.

FIG. 1 shows the configuration of a Phase Locked Loop (PLL) provided with the apparatus for detecting a difference between frequencies according to this invention. In FIG. 1, the legend 1 represents the apparatus for detecting a difference between frequencies (FWD). The legend 101 represents a first phase comparator (PD), 102 represents a second phase comparator (PD), 103 represents a frequency comparator (FD), 104 represents a selector (SEL), 105 represents a low-pass filter (LPF), 106 represents a step out detector, and 107 represents a voltage controlled oscillator (VCO) that outputs a first extracted clock (VCOCLK (1)) and a second extracted clock (VCOCLK (2)) whose phase lags a phase of the first extracted clock by 90 degrees. The first phase comparator 101, second phase comparator 102, frequency comparator 103, and the selector 104 constitute a phase frequency comparison section 111. The step out detector 106 of the first embodiment is provided only with a function of outputting a select signal to the selector 104.

The apparatus for detecting a difference between frequencies 1 of this embodiment receives a reference clock (REFCLK) having a desired frequency and a first extracted clock (VCOCLK (1)) as output by the voltage controlled oscillator 107. For example, when detecting a frequency drift of a specified value or more, the apparatus for detecting a difference between frequencies 1 outputs a step out alarm signal (LOL). The apparatus for detecting a difference between frequencies 1 may also receive a second extracted clock (VCOCLK (2)) as output by the voltage controlled oscillator 107 instead of the first extracted clock.

Figure 2:
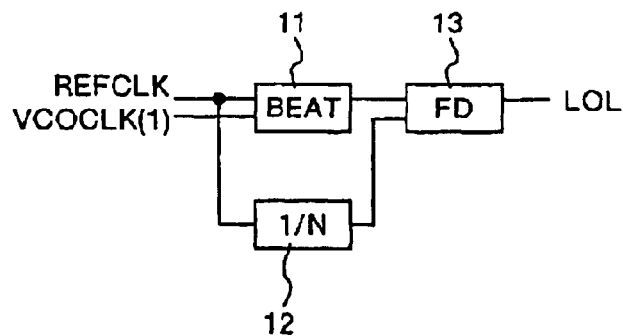
FIG. 2 shows a configuration of the apparatus for detecting a difference between frequencies according to a first embodiment.

FIG. 2 shows the configuration of the apparatus for detecting a difference between frequencies according to the first embodiment. In FIG. 2, the legend 11 represents a beat waveform generator (BEAT) that obtains a difference frequency between the reference clock and the first extracted clock and outputs a beat waveform signal having the difference frequency. The legend 12 represents a frequency divider (1/N) that divides the reference clock by N and outputs the divided reference clock, where N is a given integer and is assumed to be preset. The legend 13 represents a frequency comparator (FD) that obtains a polarity of a difference between the frequencies of the beat waveform signal as output by the beat waveform generator 11 and the divided reference clock, and outputs a binary signal (LOL) defined depending upon the obtained polarity.

Figure 3:
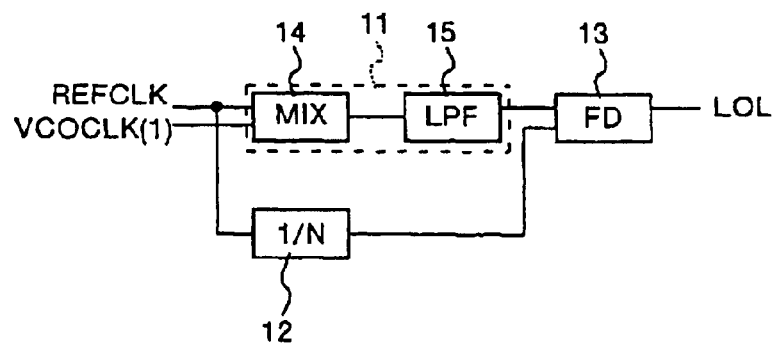
FIG. 3 shows a configuration of a beat waveform generator 11.

The operation of the apparatus for detecting a difference between frequencies according to the first embodiment will be explained below. As shown in FIG. 3, the beat waveform generator 11 is composed of a mixer (MIX) 14 and a low-pass filter (LPF) 15. For example, if we let an input signal be sin ($\omega_{REFCLK}$t+α) and a first extracted clock be sin ($\omega_{VCOCLK(1)}$t+β), a signal output from the mixer 14 in the beat waveform generator 11 is obtained as follows:

$$\sin\{(\omega_{REFCLK} - \omega_{VCOCLK(1)})t + (\alpha - \beta)\} \times \qquad (4)$$
$$\sin\{(\omega_{REFCLK} + \omega_{VCOCLK(1)})t + (\alpha + \beta)\}$$

That is, the signal output from the mixer 14 has a frequency component which is a sum and a difference between the two signals. In the expression (4), $\omega_{REFCLK}$ represents an angular frequency of the reference clock, α represents a phase of the reference clock, $\omega_{VCOCLK(1)}$ represents an angular frequency of the first extracted clock, and β represents a phase of the first extracted clock.

The low-pass filter 15 removes the sum component from the signal output from the mixer 14. Accordingly, the output signal (beat waveform signal) of the beat waveform generator 11 is obtained as follows:

$$\sin\{(\omega_{REFCLK}-\omega_{VCOCLK(1)})t+(\alpha-\beta)\} \qquad (5)$$

which can be expressed by the component as the difference between frequencies of the reference clock and the first extracted clock. The frequency of the beat waveform signal (hereafter called f(BEAT)) is a difference between frequencies of the reference clock and the first extracted clock.

The frequency comparator 13 compares the frequency of the divided reference clock (hereafter called f(1/N)) with f(BEAT). For example, the frequency comparator 13 outputs a logical signal LOW of low level as the step out alarm signal (LOL) when f(BEAT)<f(1/N), and outputs a logical signal HIGH of high level as the step out alarm signal (LOL) when f(BEAT)>f(1/N). That is, the step out alarm signal as output by the frequency comparator 13 is output when the frequency of the first extracted clock has drifted by 1/N or more with respect to the frequency of the reference clock.

As explained above, the first embodiment is configured to compare a frequency difference, between the reference clock and the extracted clock as output by the VCO in the PLL, with a frequency of a divided reference clock obtained by dividing the reference clock by N, and to output a step out alarm signal according to the result of the comparison. Accordingly, when the frequency of the extracted clock has drifted by the specified value or more with respect to the frequency of the reference clock, the step out alarm signal can be output. Further, by setting a frequency division ratio N of the frequency divider to a give value, the output condition of the step out alarm signal can be made variable.

The operation of the apparatus for detecting a difference between frequencies according to a second embodiment will be explained below. Note that the configuration of the PLL is the same as that of the first embodiment. Therefore, only those parts of the operation which are different from the first embodiment will be explained here.

Figure 4:
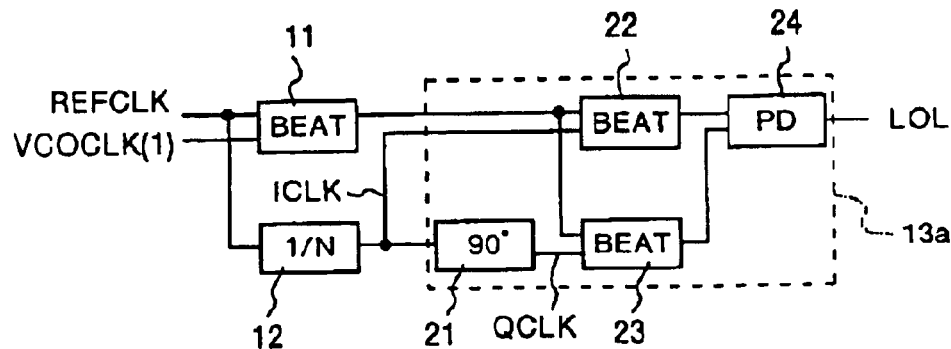
FIG. 4 shows a configuration of the apparatus for detecting a difference between frequencies according to a second embodiment.

FIG. 4 shows the configuration of the apparatus for detecting a difference between frequencies according to the second embodiment. The same legends are assigned to those common to the sections in FIG. 2, and an explanation of those sections is omitted. In FIG. 4, the legend 13a represents a frequency comparator (FD), and 21 represents a delay unit (90°) that adds a delay of ¼ period (90°) to the divided reference clock (hereafter called ICLK) as output by the frequency divider 12 and outputs the delayed reference-clock signal (hereafter called QCLK). The legend 22 represents a beat waveform generator (BEAT) that outputs a first beat waveform signal having a frequency which is equal to a difference between frequencies of the beat waveform signal as output by the beat waveform generator 11 and the ICLK. The legend 23 represents a beat waveform generator (BEAT) that outputs a second beat waveform signal having a frequency which is equal to a difference between frequencies of the beat waveform signal and the QCLK. The legend 24 represents a phase comparator (PD) that compares phases of the first beat waveform signal and the second beat waveform signal.

The operation of the apparatus for detecting a difference between frequencies according to the second embodiment will be explained below. The configuration and operation of the beat waveform generator 22 and beat waveform generator 23 are the same as that of the beat waveform generator 11, therefore, an explanation of these two generators is omitted.

If we let an angular frequency of the beat waveform signal be $\omega_{BEAT(1)}$ and an angular frequency of ICLK and QCLK be $\omega_{ICLK}$, the first beat waveform signal can be expressed, like the expression (5), as follows:

$$\sin\{(\omega_{BEAT(1)}-\omega_{ICLK})t+(\alpha-\beta)\} \qquad (6)$$

The second beat waveform signal can be expressed as follows:

$$-\cos\{(\omega_{BEAT(1)}-\omega_{ICLK})t+(\alpha-\beta)\} \qquad (7)$$

Figure 5A:
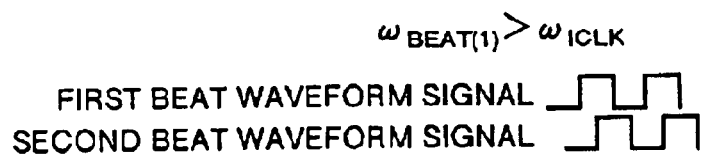
FIG. 5A and FIG. 5B show a phase relationship between the first beat waveform signal and the second beat waveform signal.
Figure 5B:

FIGS. 5A and 5B each show a phase relationship between the first beat waveform signal and the second beat waveform signal.

The phase comparator 24 compares the phase relationship shown in FIG. 5A or FIG. 5B, and outputs a HIGH signal (when $\omega_{BEAT(1)}>\omega_{ICLK}$, f(BEAT)>f(1/N)) when the phase of the first beat waveform signal lags the phase of the second beat waveform signal. Further, the phase comparator 24 outputs a LOW signal (when $\omega_{BEAT(1)}<\omega_{ICLK}$, f(BEAT)<f(1/N)) when the phase of the first beat waveform signal leads the phase of the second beat waveform signal. That is, the step out alarm signal as output by the frequency comparator 13a is output when the frequency of the first extracted clock has drifted by 1/N or more with respect to the frequency of the reference clock.

The phase comparator 24 is composed of a rising edge type of D type flip-flop, and receives, for example, the first beat waveform signal at a data terminal, and receives the second beat waveform signal at a clock terminal.

As explained above, the second embodiment is configured to obtain a frequency difference between a beat waveform signal, having a frequency which is equal to a difference between frequencies of the reference clock and the extracted clock as output of the VCO in the PLL, and a divided reference clock obtained by dividing the reference clock by N. This second embodiment is also configured to obtain a frequency difference between the beat waveform signal and a delayed reference clock obtained by adding a delay of ¼ period to the divided reference clock, and to compare these two frequency differences to output a step out alarm signal according to the result of the comparison. Accordingly, when the frequency of the extracted clock has drifted by the specified value or more with respect to the frequency of the reference clock, the step out alarm signal can be output. Further, by setting a frequency division ratio N of the frequency divider to a give value, the output condition of the step out alarm signal can be made variable.

The operation of the apparatus for detecting a difference between frequencies according to a third embodiment will be explained below. Note that the configuration of the PLL is the same as that of the first embodiment. Therefore, only those parts of the operation which are different from the first embodiment will be explained here.

Figure 6:
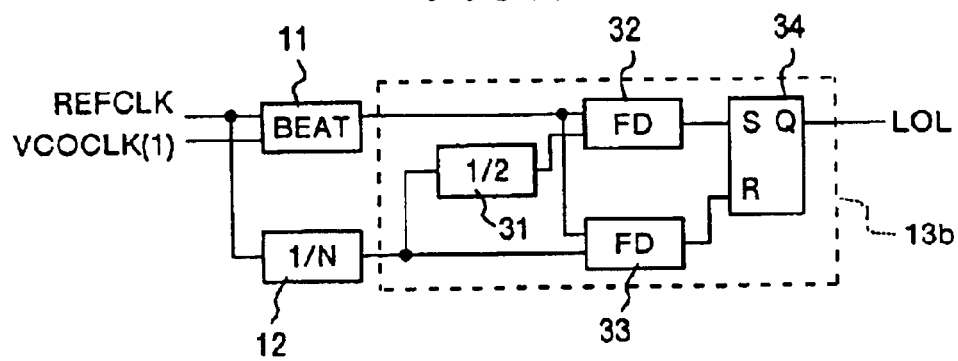
FIG. 6 shows a configuration of the apparatus for detecting a difference between frequencies according to a third embodiment.

FIG. 6 shows the configuration of the apparatus for detecting a difference between frequencies according to the third embodiment. The same legends are assigned to those common to the sections shown in FIG. 2, and an explanation of these sections is omitted. In FIG. 6, the legend 13b represents a frequency comparator (FD), and 31 represents a frequency divider (½) that divides the divided reference clock as output by the frequency divider 12 by 2, and outputs the divided-divided reference clock. The legend 32 represents a frequency comparator (FD) that outputs a binary signal defined depending upon a frequency difference between the beat waveform signal as output by the beat waveform generator 11 and the divided-divided reference clock. The legend 33 represents a frequency comparator (FD) that outputs a binary signal defined depending upon a frequency difference between the beat waveform signal and the divided reference clock. The legend 34 represents a set-reset type flip-flop (hereafter called SR-FF) that receives the output signal from the frequency comparator 32 at a set terminal and receives the output signal from the frequency comparator 33 at a reset terminal.

The operation of the apparatus for detecting a difference between frequencies of the third embodiment will be explained below. The frequency comparators 32 and 33 operate in the same manner as the frequency comparator 13.

The frequency comparator 32 compares a frequency of the beat waveform signal (f(BEAT)) with a frequency of the divided-divided reference clock (hereafter called f(1/2N)), outputs a LOW signal when f(BEAT)<f(1/2N), and outputs a HIGH signal when f(BEAT)>f(1/2N). The SR-FF 34 sets the output based on the condition of f(BEAT)>f(1/2N).

On the other hand, the frequency comparator 33 compares frequencies of f(BEAT) and the divided reference clock (f(1/N)), outputs a LOW signal when f(BEAT)>f(1/N), and outputs a HIGH signal when f(BEAT)<f(1/N). The SR-FF 34 resets the output based on the condition of f(BEAT)<f(1/N).

Figure 7:
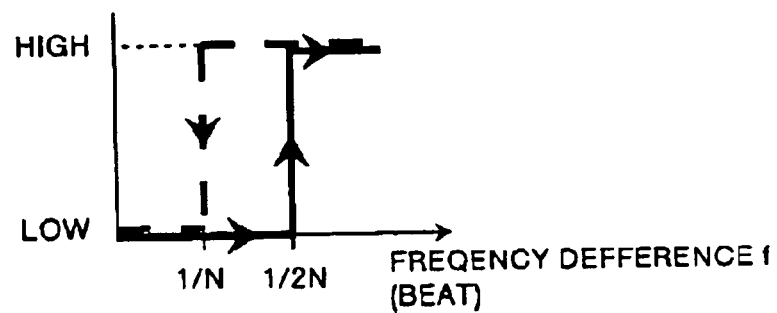
FIG. 7 shows a relationship of hysteresis related to output and release of a step out alarm signal.

Therefore, if we let the output of the SR-FF 34 be a step out alarm signal, the condition of the output is f(BEAT)>f(1/2N), which indicates the state where a frequency of the first extracted clock has drifted by 1/2N or more with respect to the frequency of the reference clock. The condition of releasing the step out alarm signal is f(BEAT)<f(1/N), which indicates the state where a frequency difference between the first extracted clock and the reference clock becomes 1/N or less. That is, in the apparatus for detecting a difference between frequencies of this embodiment, a hysteresis relationship is applied to conditions for output and release of the step out alarm signal. FIG. 7 shows the relationship of the hysteresis.

As explained above, the third embodiment is configured to output the step out alarm signal at the frequency difference of a set first specified value or more, and to release the alarm signal at the frequency difference of a set second specified value or less. That is, a hysteresis relationship is applied to the conditions for output and release of the step out alarm signal. Accordingly, when the frequency of the extracted clock has drifted by the first specified value or more with respect to the frequency of the reference clock, the step out alarm signal can be output. Further, when the frequency drift of the extracted clock has recovered to within the second specified value with respect to the frequency of the reference clock, the step out alarm signal can be released. Furthermore, by setting the frequency division ratio N of the frequency divider to a given value, the output condition and release condition of the step out alarm signal can be made variable.

Figure 8:
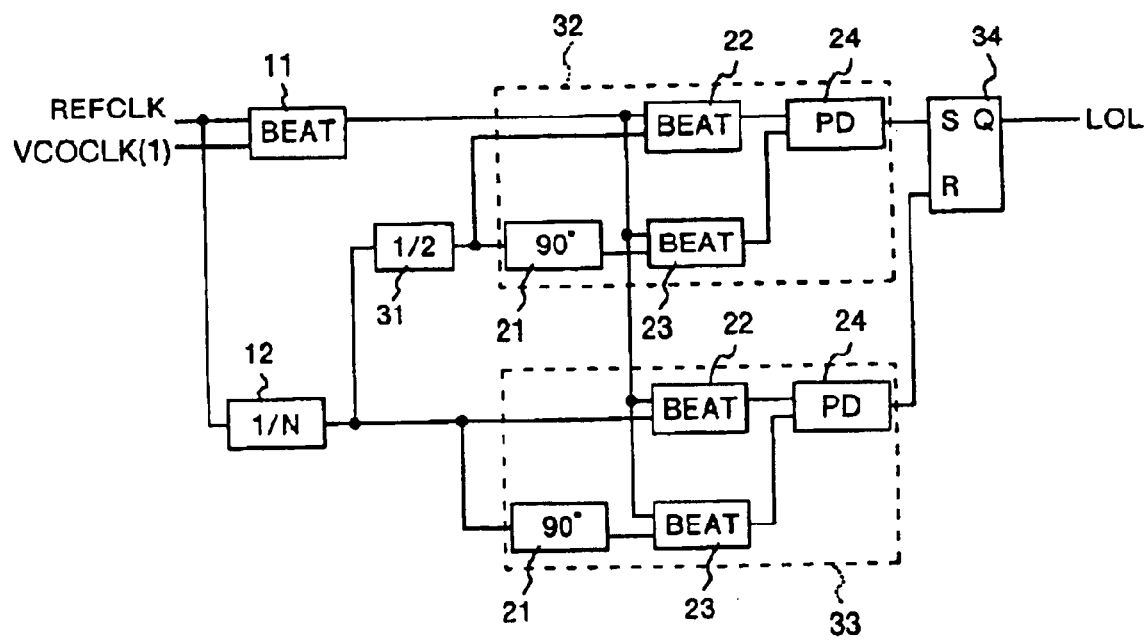
FIG. 8 shows a configuration of the apparatus for detecting a difference between frequencies according to a fourth embodiment.
Figure 9:
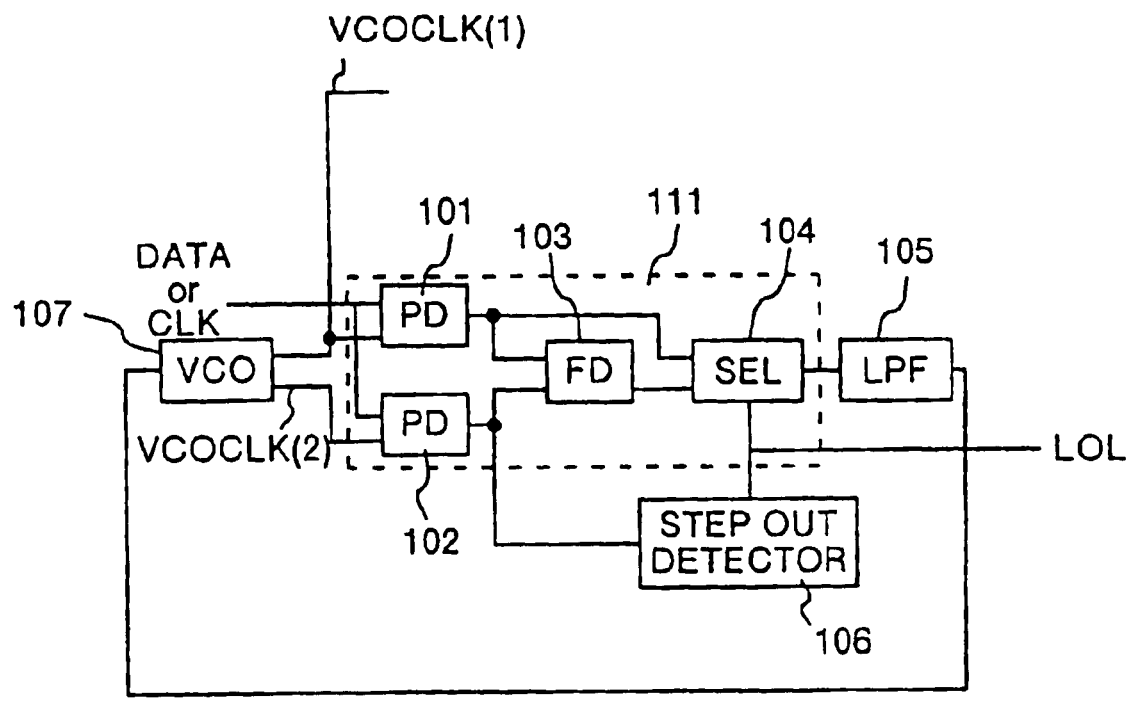
FIG. 9 shows a configuration of the conventional PLL.
Figure 10:
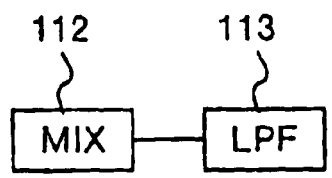
FIG. 10 shows a configuration of the conventional phase comparator.

The operation of the apparatus for detecting a difference between frequencies according to a fourth embodiment will be explained below. Note that the configuration of the PLL is the same as that of the first embodiment. Further, the configuration of the apparatus for detecting a difference between frequencies of the fourth embodiment is the same as that of the third embodiment. FIG. 8 shows the configuration of the apparatus for detecting a difference between frequencies of the fourth embodiment. Therefore, only those parts of the operation which are different from the third embodiment will be explained here.

The internal configuration of the frequency comparators 32 and 33 is the same as that of the second embodiment shown in FIG. 4, while the output condition of the phase comparator 24 is set in reverse to that of the second embodiment. That is, in the frequency comparator 33, when the phase of the first beat waveform signal lags the phase of the second beat waveform signal, a LOW signal (when $\omega_{BEAT(1)} > \omega_{ICLK}$, f(BEAT)>f(1/N)) is output while a HIGH signal (when $\omega_{BEAT(1)} < \omega_{ICLK}$, f(BEAT)<f(1/N)) is output when the phase of the first beat waveform signal leads the phase of the second beat waveform signal. Accordingly, the output signal of the SR-FF 34, like the third embodiment, is set based on the condition of f(BEAT)>f(1/2N), and is reset based on the condition of f(BEAT)<f(1/N).

As explained above, the fourth embodiment is configured to output the step out alarm signal at the frequency difference of the set first specified value or more, and to release the alarm signal at the frequency difference of the set second specified value or less. That is, the hysteresis relationship is applied to the conditions for output and release of the step out alarm signal. Accordingly, when the frequency of the extracted clock has drifted by the first specified value or more with respect to the frequency of the reference clock, the step out alarm signal can be output. Further, when the frequency drift of the extracted clock has recovered to within the second specified value with respect to the frequency of the reference clock, the step out alarm signal can be released. Furthermore, by setting the frequency division ratio N of the frequency divider to a given value, the output condition and release condition of the step out alarm signal can be made variable.

According to one aspect of this invention, a frequency difference between the reference clock signal and the target clock signal is compared with a frequency of the divided reference-clock signal which is obtained by dividing the reference clock signal by N. The step out alarm signal is output according to the result of the comparison. Accordingly, there is an advantageous effect that the step out alarm signal can be output when the frequency of the clock signal has drifted by a specified value or more with respect to the frequency of the reference clock signal. There is another advantageous effect that the output condition of the step out alarm signal can be made variable by setting the frequency division ratio N to a given value.

Further, a frequency of the beat waveform signal, which is equal to a difference between frequencies of the reference clock signal and the target clock signal, is compared with a frequency of the divided reference clock which is obtained by dividing the reference clock signal by N. Thus, a difference between these frequencies of the beat waveform signal and the divided reference clock is obtained. On the other hand, a frequency of the beat waveform signal is compared with a frequency of the delayed reference clock which is obtained by adding a delay of ¼ period to the divided reference clock. Thus, a difference between the frequencies of the beat waveform signal and the delayed reference clock is obtained. These two frequency differences are compared, and the step out alarm signal is output according to the result of the comparison. Accordingly, there is an advantageous effect that the step out alarm signal can be output when the frequency of the clock signal has drifted by the specified value or more with respect to the frequency of the reference clock signal. There is another advantageous effect that the output condition of the step out alarm signal can be made variable by setting the frequency division ratio N to a given value.

Further, the step out alarm signal is output at a frequency difference of a first specified value or more which is determined based on the reference clock signal and the frequency division ratio N. The step out alarm signal is released at a frequency difference of a second specified value (which is not equal to the first specified value) or less and which is determined based on the reference clock signal and the frequency division ratio N. That is, a hysteresis relationship is applied to the conditions for output and release of the step out alarm signal. Accordingly, there is an advantageous effect a) that the step out alarm signal can be output when the frequency of the target clock signal has drifted by the first specified value or more with respect to the frequency of the reference clock signal, and b) that the step out alarm signal can be released when the frequency drift of the target clock signal has recovered to within the second specified value with respect to the frequency of tie reference clock signal. There is another advantageous effect that the output condition and release condition of the step out alarm signal can be made variable by setting the frequency division ratio N to a given value.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An apparatus for detecting a difference between frequencies, the apparatus comprising:
   a beat waveform generating unit which generates a beat waveform signal having a frequency which is equal to a difference between frequencies of a reference clock signal and a target clock signal;
   a reference-clock dividing unit which divides the reference clock signal by N, where N is an integer, to generate a divided reference-clock signal; and
   a frequency comparing unit which compares frequencies of the beat waveform signal and the divided reference-clock signal, and generates a step out alarm signal which is a binary signal depending upon a polarity of a difference between the frequencies of the beat waveform signal and the divided reference-clock signal, wherein the frequency comparing unit includes,
   a first reference-clock dividing unit which divides the divided reference-clock signal by 2 to generate a divided-divided reference-clock signal;
   a first frequency comparing unit which compares frequencies of the beat waveform signal and the divided-divided reference-clock signal, and generates a first binary signal depending upon a polarity of a difference between the frequencies of the beat waveform signal and the divided-divided reference-clock signal;
   a second frequency comparing unit which compares frequencies of the beat waveform signal and the divided reference-clock signal, and generates a second binary signal depending upon a polarity of a difference between the frequencies of the beat waveform signal and the divided reference-clock signal; and
   a set-reset type flip-flop unit which controls generation and output of the step out alarm signal by receiving one of the first and second binary signals at a set terminal and receiving a remaining one of the first and second binary signals at a reset terminal.

2. The apparatus according to claim 1, wherein the set-reset type flip-flop unit outputs the step out alarm signal when the frequency of the target clock signal has drifted by a first specified value or more with respect to the frequency of the reference clock signal.

3. The apparatus according to claim 2, wherein the set-reset type flip-flop unit stops the step out alarm signal from being output when the frequency drift of the target clock signal has recovered to within a second specified value, which is different from the first specified value, with respect to the frequency of the reference clock signal.

4. The apparatus according to claim 1, wherein the first frequency comparing unit includes,
   a first beat waveform generating unit which generates a first beat waveform signal having a frequency which is equal to a difference between frequencies of the beat waveform signal and the divided-divided reference-clock signal;
   a first delay adding unit which adds a delay of ¼ period to the divided-divided reference-clock signal to generate a delayed divided-divided reference-clock signal;
   a second beat waveform generating unit which generates a second beat waveform signal having a frequency which is equal to a difference between frequencies of the beat waveform signal and the delayed divided-divided reference-clock signal; and
   a first phase comparing unit which compares phases of the first beat waveform signal and the second beat waveform signal, obtains a polarity of a difference between the phases of the first beat waveform signal and the second beat waveform signal, and outputs the first binary signal depending upon the obtained polarity; and
   the second frequency comparing unit includes,
   a third beat waveform generating unit which generates a third beat waveform signal having a frequency which is equal to a difference between frequencies of the beat waveform signal and the divided reference-clock signal;
   a second delay adding unit which adds a delay of ¼ period to the divided reference-clock signal to obtain a delayed divided reference-clock signal;

a fourth beat waveform generating unit which generates a fourth beat waveform signal having a frequency which is equal to a difference between frequencies of the beat waveform signal and the delayed divided reference-clock signal; and a second phase comparing unit which compares phases of the third beat waveform signal and the fourth beat waveform signal, obtains a polarity of a difference between the phases of the third beat waveform signal and the fourth beat waveform signal and outputs the second binary signal depending upon the obtained polarity.

5. The apparatus according to claim 4, wherein the set-reset type flip-flop unit outputs the step out alarm signal when the frequency of the target clock signal has drifted by a first specified value or more with respect to the frequency of the reference clock signal.

6. The apparatus according to claim 5, wherein the set-reset type flip-flop unit does not output the step out alarm signal when the frequency drift of the target clock signal has recovered to within a second specified value, which is different from the first specified value, with respect to the frequency of the reference clock signal.

7. The apparatus according to claim 4, further comprising a changing unit which changes the value of N.

8. A method of detecting a difference between frequencies, the method comprising:

generating a beat waveform signal having a frequency which is equal to a difference in frequencies of a reference clock signal and a target clock signal;

dividing the reference clock signal by N, where N is an integer, to generate a divided reference-clock signal; and obtaining a polarity of a difference between the frequencies of the beat waveform signal and the divided reference-clock signal, and generating a step out alarm signal which is a binary signal depending upon the obtained polarity, wherein the process of obtaining the polarity and generating the step out alarm signal comprises:

dividing the divided reference-clock signal by 2 to generate a divided-divided reference-clock signal;

obtaining a polarity of a difference between the frequencies of the beat waveform signal and the divided-divided reference-clock signal, and generating a first binary signal depending upon the obtained polarity;

obtaining a polarity of a difference between the frequencies of the beat waveform signal and the divided reference-clock signal, and generating a second binary signal depending upon the obtained polarity; and controlling the generation and output of the step out alarm signal based on the first and second binary signals.

9. The method according to claim 8, in the process of controlling the generation and output of the step out alarm signal the step out alarm signal is output when the frequency of the target clock signal has drifted by a first specified value or more with respect to the frequency of the reference clock signal.

10. The method according to claim 9, in the process of controlling the generation and output of the step out alarm signal the step out alarm signal is stopped from being output when the frequency drift of the target clock signal has recovered to within a second specified value, which is different from the first specific value, with respect to the frequency of the reference clock signal.

* * * * *